United States Patent [19]

Hasegawa et al.

[11] Patent Number: 5,282,289
[45] Date of Patent: Feb. 1, 1994

[54] SCRUBBER APPARATUS FOR CLEANING A THIN DISK WORK

[75] Inventors: Fumihiko Hasegawa, Urawa; Makoto Tsukada, Tokorozawa; Hideo Kudo, Fukushima; Masayuki Yamada, Shirakawa; Isao Uchiyama, Fukushima, all of Japan

[73] Assignee: Shin-Etsu Handotai Co., Ltd., Tokyo, Japan

[21] Appl. No.: 998,076

[22] Filed: Dec. 28, 1992

[30] Foreign Application Priority Data

Dec. 27, 1991 [JP] Japan .................................. 3-358060

[51] Int. Cl.$^5$ .............................................. B08B 11/02
[52] U.S. Cl. ...................................... 15/21.1; 15/97.1; 15/88.2; 51/131.5; 51/235
[58] Field of Search ................... 15/21.1, 88.2, 97.1; 51/4, 24, 131.5, 235

[56] References Cited

U.S. PATENT DOCUMENTS

| | | | |
|---|---|---|---|
| 4,811,443 | 3/1989 | Nishizawa | 15/97.1 |
| 5,092,011 | 3/1992 | Gommori et al. | 15/88.2 |
| 5,144,711 | 9/1992 | Gill, Jr. | 15/21.1 |

Primary Examiner—Edward L. Roberts
Attorney, Agent, or Firm—Lowe, Price, LeBlanc & Becker

[57] ABSTRACT

A scrubber cleaner for cleaning the unsucked face and peripheral chamfers of a semiconductor wafer. A wafer holder capable of holding the wafer by vacuum suction and turning the wafer circumferentially, and including a wafer suction head for fixing the wafer on it and a motor to rotate the suction head. A brush assembly including a rotatory plate having a brushing surface on one side consisting of a flat ring portion and a side-of-cylinder portion, and being capable of shifting axially and in radial directions; a motor for rotating the rotatory plate circumferentially; an air cylinder for shifting the rotatory plate axially; and another air cylinder for shifting the rotatory plate in radial directions. The side-of-cylinder portion of the brushing surface axially extends from the inner boundary of the ring portion, and the rotatory plate is disposed such that the flat ring portion of the brushing surface of the brush is opposed to and in parallel to the unsucked face of the wafer which is held on the suction head.

2 Claims, 4 Drawing Sheets

SCRUBBER APPARATUS FOR CLEANING A THIN DISK WORK

BACKGROUND OF THE INVENTION

The present invention relates to a scrubber cleaning apparatus for cleaning a thin disk work, such as semiconductor wafers; more particularly the invention relates to a scrubber apparatus for holding a thin disk work by sucking at one of the faces thereof by means of a sucking means and cleaning the circumferential periphery as well as that face of the work which is not being sucked (hereinafter "unsucked face").

PRIOR ART

A semiconductor wafer, which is used to make substrates for semiconductor devices, is obtained from a single crystal ingot, such as one grown of molten polycrystal silicon, by slicing the ingot into thin disks orthogonally to the axis of the ingot, which disks are then chambered, lapped, etched, annealed, polished, and given other finishing treatments.

As for the chamfering, the entire edges of the semiconductor wafer are chamfered so as to fashion the wafer edges difficult to chip; however, the current tendency is to polish the chamfers and make them glossy (specular finish polishing) so as to nullify the possibility of creation of particles due to microscopic chipping and to prevent slippage of the wafer during thermal treatment.

In the polishing operation to make the wafer chamfers glossy, slurry (polishing liquid) is used. However, when the slurry remains on the wafer after the specular finish polishing, the wafer may be locally etched and such surface is liable to be damaged. Hence, the slurry sticking to the wafer ought to be removed as quickly as possible.

Thus, methods have been adopted (i) wherein the wafer after specular finish polishing is dropped in water to wash the slurry off the wafer surface or (ii) wherein the wafer after specular finish polishing is held between a pair of rotatory brushes and the wafer itself.

Problems the Invention Seeks to Solve

However, it is impossible to entirely remove the sticking slurry by merely dropping the wafer in water. Also, in the case of the method of removing the slurry by brushing between the rotatory brushes, although it is possible to remove the slurry from the both faces of the wafer, it is not possible to effectively remove the slurry sticking on the chamfers made along the periphery of the wafer.

The present invention was contrived in view of these problems, and it is, therefore, an object of the invention to provide a cleaning apparatus which can scrub one face of a thin disk work and the edges thereof at the same time and thus clean them effectively.

SUMMARY OF THE INVENTION

Means to Solve the Problems

Herein is proposed, therefore, a new scrubber cleaning apparatus for cleaning a thin disk work, comprising:

a work holder means capable of holding the work by vacuum suction and turning the work circumferentially, and including a work suction head for fixing a work on it and a drive means to rotate said suction head; and a brush means including: a rotatory plate having a brushing surface on one side thereof, the brushing surface consisting of a flat ring portion and a side-of-cylinder portion, and being capable of shifting axially and in radial directions; a drive means for rotating said rotatory plate; a drive means for shifting said rotatory plate axially; and a drive means for shifting said rotatory plate in radial directions, said side-of-cylinder portion of said brushing surface being axially extending from the inner boundary of said ring portion, and said rotatory plate being disposed such that said flat ring portion of the brushing surface of the brush means is opposed to and in parallel to the unsucked face of the work which is held on the suction head.

Preferably, the suction head is turned in the same direction as the rotatory plate of the brush means, so that the side-of-cylinder portion runs counter to the peripheral chamfers of the work.

Effects of the Invention

According to the invention, therefore, the thin work is sucked by the work suction head and turned, and meanwhile the rotatory plate of the brush means is also turned and shifted axially so that the flat ring portion of the brushing (scrubbing) surface is first pressed on the unsucked face of the wafer, and thereafter the rotatory plate is moved sideways so that the side-of-cylinder portion is pressed on the peripheral chamfers of the wafer; consequently, the unsucked face of the wafer is scrubbed by the flat ring portion of the brushing surface and, almost at the same time, the peripheral chamfers of the which are scrubbed by the side-of-cylinder portion of the brushing surface. Since it is so arranged that the side-of-cylinder portion runs counter to the peripheral chamfers of the wafer, the chamfers are thoroughly cleaned, let alone the unsucked face of the wafer.

EMBODIMENTS

Next, an embodiment of the present invention, considered as the best mode, will be described with reference to the attached drawings.

Figure 1:
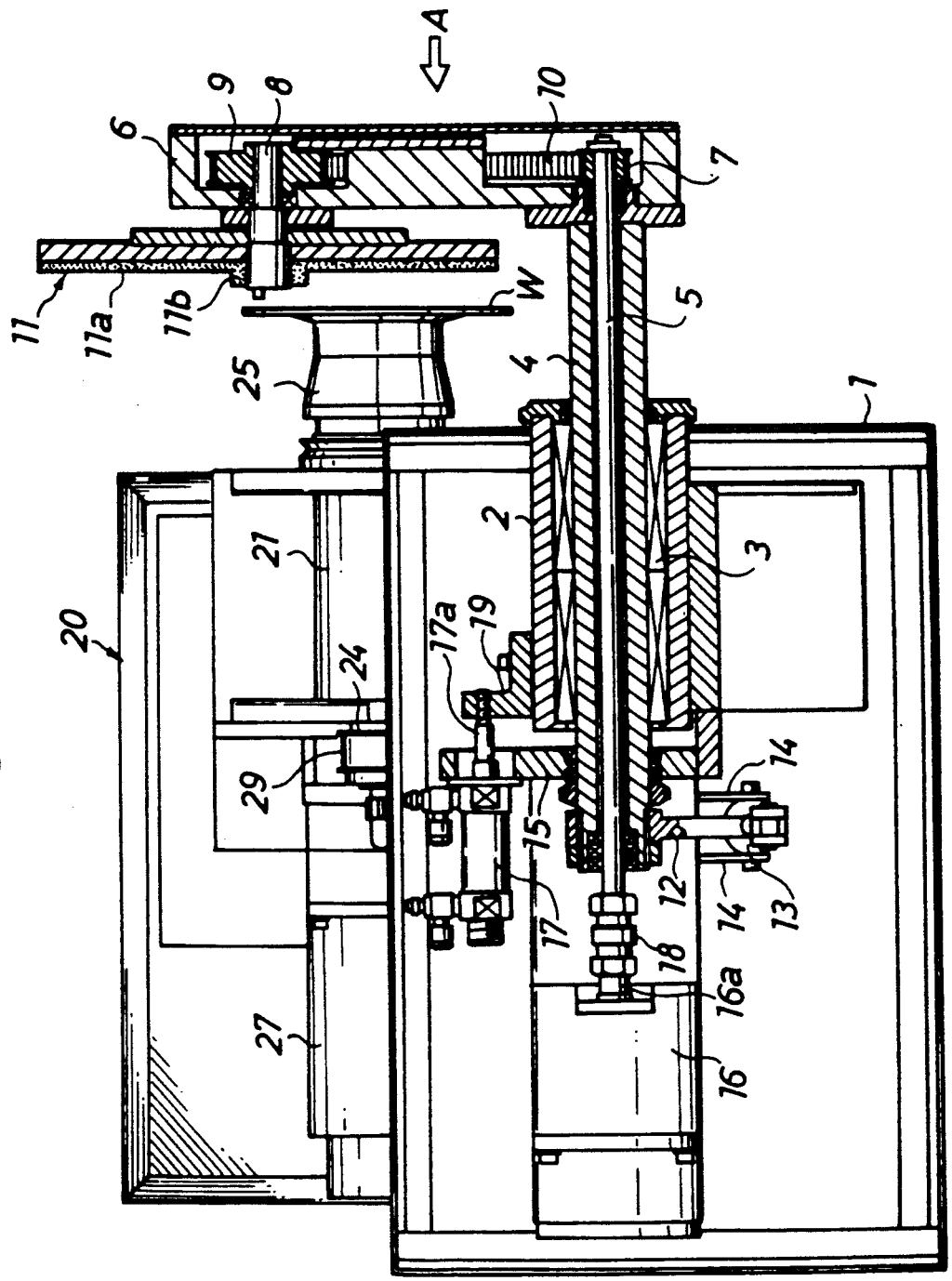
FIG. 1 is a horizontal cross section of a scrubber cleaning apparatus according to the present invention.
Figure 2:
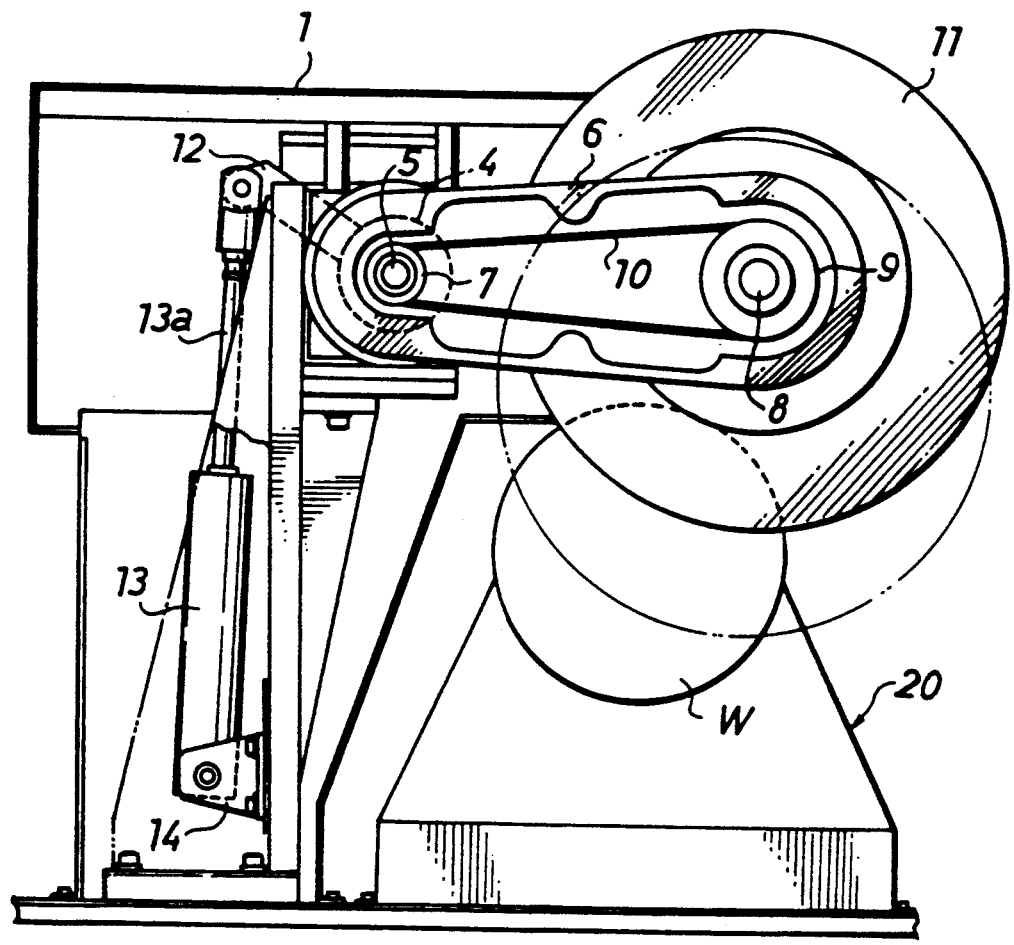
FIG. 2 is a view of the same cleaning apparatus of FIG. 1 seen in the direction indicated by the arrow A.
Figure 3:
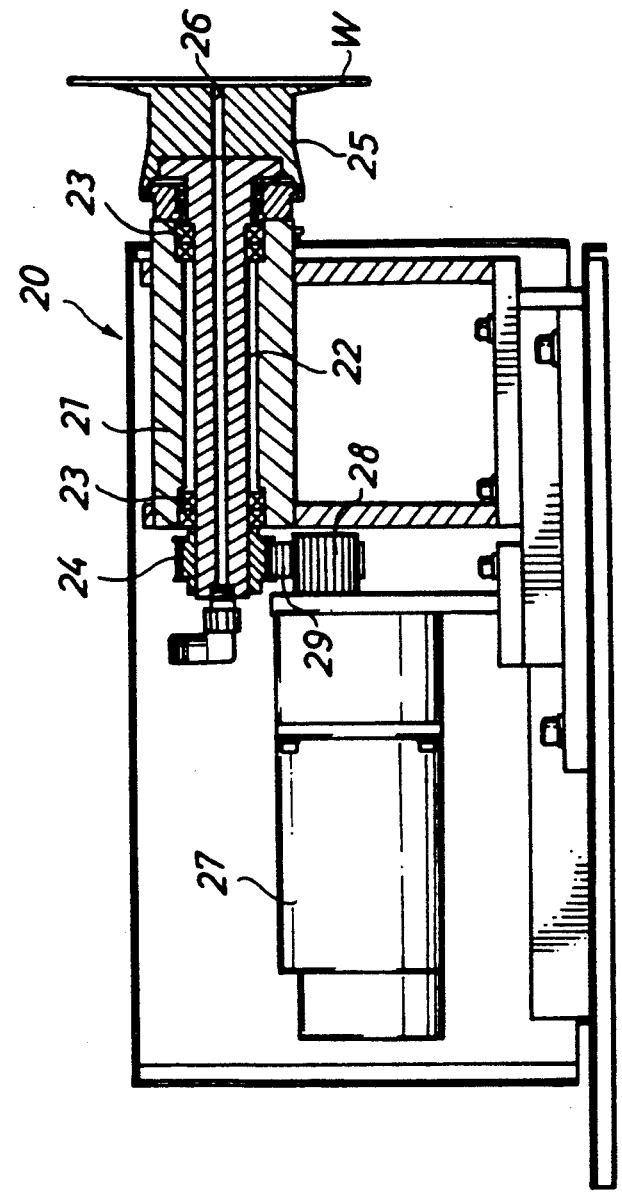
FIG. 3 is a vertical cross section of a work suction rotary assembly of the cleaning apparatus.
Figure 4:
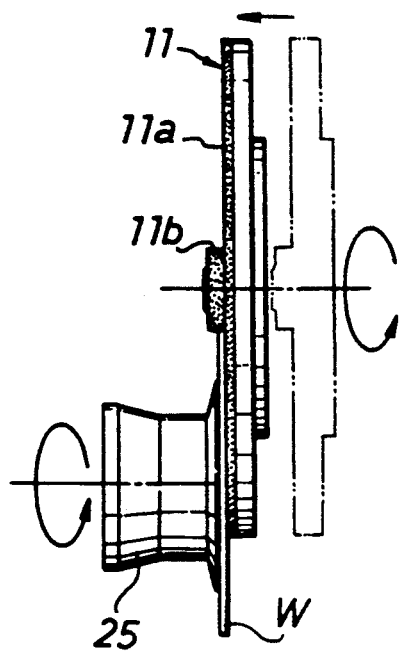
FIG. 4 is a side view of a rotatory brush to show the position of the wafer in relation to the rotatory brush.
Figure 5:
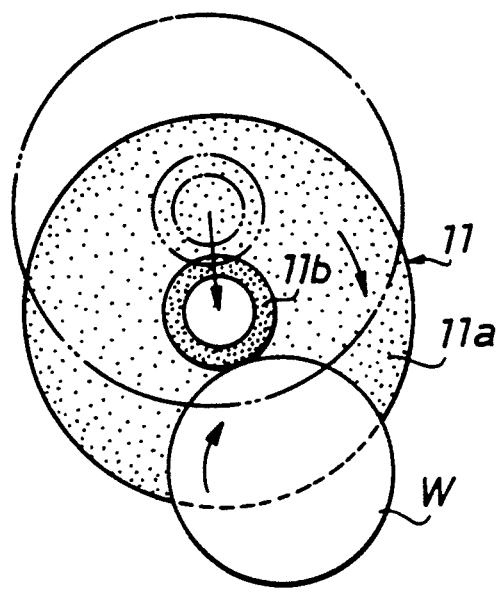
FIG. 5 is a front view of the rotatory brush so show the position of the wafer in relation to the rotatory brush.

FIG. 1 is a horizontal cross section of a scrubber cleaning apparatus according to the present invention; FIG. 2 is a view of the same cleaning apparatus of FIG. 1 seen in the direction indicated by the arrow A; FIG. 3 is a vertical cross section of a work suction rotary assembly; and FIG. 4 and FIG. 5 are, respectively, a side view and a front view of a rotatory brush to show the position of the wafer in relation to the rotatory brush.

In FIG. 1 and FIG. 2, the reference numeral 1 designates a casing, and a holder 2 is horizontally fixed at an upper part inside the casing 1, and a ball bush 3 is set inside the holder 2. A horizontal duplex construction, consisting of a hollow shaft 4 and a solid rotatory shaft 5 inserted therein, is inserted in the holder 2 in a manner such that the duplex construction is capable of freely sliding to and fro inside the holder 2 (right-ward and left-ward in FIG. 1).

A case 6 is fixedly connected at its one end to the free end of the hollow shaft 4 which extends out from the casing 1, and a pulley 7 is locked about that end of the rotatory shaft 5 which is disposed in the case 6. Incidentally, the rotatory shaft 5 is supported in a manner such that it can freely rotate in the hollow shaft 4.

Also, a rotatory shaft 8 is supported by the case 6 at the other end thereof in a manner such that the shaft 8 is parallel to the rotatory shaft 5 and is freely rotative, and a pulley 9 is locked about that end portion of the rotatory shaft 8 which is disposed in the case 8. A belt 10 is passed round the pulley 9 and the pulley 7 to thereby connect them. A rotatory brush 11 having a shape of circular disk is locked about that end portion of the rotatory shaft 8 which extends out from the case 6, and this rotatory brush 11 consists of a flat portion 11a and an cylindrical protrusion portion 11b axially embossed from the middle of the flat portion 11a. The brushing surfaces of this rotatory brush 11 consist of a flat ring portion and a side-of-cylinder portion (the side of the embossed cylinder 11b). Incidentally, these brushing surfaces are planted densely with hair such as plastic hair.

An arm 12 is locked about that end of the hollow shaft 4 which is disposed in the casing 1, and to the free end of the arm 12 is connected pivotally a rod 13a of a cylinder 13, which is a drive means; the other end of the cylinder 13 is pivotally connected to a bracket 14, which is fixed on the casing 1.

A vertical plate 15 is provided in the casing 1 and the hollow shaft 4 is supported by the plate 15 in a manner such that the shaft 4 can freely rotate on the plate 15. A drive motor 16 as the revolver means and a cylinder 17, as the shifter means are fixed to the plate 15, and the output shaft 16a of the drive motor 16 is connected via a coupling 18 to that end of the rotatory shaft 5 which is inside the casing 1. Also, the rod 17a extending from the cylinder 17 is fixed in a bracket 19, which is bolted on the holder 2.

As shown in FIG. 1, an assembly 20 having a rotatory suction head 25 for holding and turning the work is annexed to the side of the casing 1. Next, therefore, the construction and structure of the work holder assembly 20 will be described with reference to FIG. 3.

A frame 21 is horizontally fixed near the ceiling of the work holder assembly 20, and a rotatory shaft 22 is inserted in the frame 21 and borne horizontalloy by a set of bearing 23 in a manner such that the shaft 22 can rotate freely. A pulley 24 is locked about one end of the rotatory shaft 22 (the end which is remote from the brush 11) and a suction head 25 is locked about the other end of the shaft 22 (the end which opposes the brush 11). A bore 26, which is a vacuum passage, penetrates through the centers of the rotatory shaft 22 and the suction head 25, and this bore 26 communicates with a vacuum pump, not shown.

A drive motor 27 of speed variable type is fixed behind the rotatory shaft 22 inside the work holder assembly 20, and the output shaft of the motor 27 is disposed underneath the rear end of the shaft 22, and a belt 29 is passed round a pulley 28 locked about the output shaft of the drive motor 27 and the pulley 24 to thereby connect them.

Next, the operation of the scrubber cleaning apparatus of the invention will be described.

In particular, the description will concern the case where a semiconductor wafer W is cleaned whose peripheral chamfers have been polished with slurry to specular gloss. As the vacuum pump, not shown, is driven to draw the air from the vacuum passage bore 26, this semiconductor wafer W is sucked by the negative pressure created in the passage bore 26, and pressed on the face of the suction head 25 of the work holder assembly 20 and thus held vertically, as shown. Then, the drive motor 27 is driven and its rotation torque created is transmitted to the rotation shaft 22 via the pulley 28, belt 29 and pulley 24, whereupon the shaft 22 is caused to turn at a regular rotational speed together with the wafer W held at the suction head 25.

Meanwhile, the drive motor 16 is driven and its rotational torque is transmitted to the rotatory shaft 8 via the output shaft 16a, coupling 18, rotatory shaft 5, pulley 7, belt 10 and pulley 9, whereupon the rotatory shaft 8 together with the rotatory brush 11 is caused to turn at a regular rotational speed. Next, while the wafer W and the brush 11 are turning the air cylinder 17 is driven such that the rod 17a is pushed out, whereby the cylinder 17, plate 15, drive motor 16, hollow shaft 4 and rotatory shaft 5 are altogether pushed back (left-ward as seen in FIG. 1), and the rotatory brush 11 interconnected to the hollow shaft 4 is also shifted and, as the result, the flat portion 11a of the rotatory brush 11 comes in contact with the unsucked face of the wafer W, as shown in FIG. 4.

Thereafter, as the air cylinder 13 is operated such that its rod 13a is pushed out, the arm 12 and the hollow shaft 4 are turned about the axis of the shaft 4 clockwise, as seen in FIG. 2. As the result, the rotatory brush 11 supported integrally by the hollow shaft 4 is swung a little from its position drawn in solid line, in FIG. 2, to a lower position drawn in two-dot chain line. Hence, the rotatory brush 11 is shifted along a circular locus, or, in other words, in continuously changing and always radial directions. Consequently, as shown in FIG. 5, the embossed portion 11b of the rotatory brush 11 is brought to ride on the peripheral edge of the wafer W.

Now, it is so arranged that the wafer W is turned in the same direction as the brush 11 and, as the result, the circumference of the turning embossed portion 11 runs in the opposite direction to the running edge of the wafer W in a manner such that they rub against each other. Hence, the unsucked face of the wafer W is scrubbed by the flat portion 11a of the rotatory brush 11 and the peripheral chamfers of the same wafer W are scrubbed by the embossed portion 11b of the rotatory brush 11 so that both the unsucked face and the peripheral chamfers of the wafer W are effectively cleaned almost simultaneously in one course of scrubbing operation.

Incidentally, in this embodiment, the unsucked face and the peripheral chamfers of the wafer W are scrubbed clean but the sucked face remains uncleaned; however, since the sucked face will be polished at the next polishing step, this is not a problem.

Results of the Invention

As is clear from the above description, according to the invention, there is provided a scrubber cleaning apparatus which in essence consists of:

a work (wafer) holder means capable of holding a wafer by cacuum suction and turning the wafer circumferentially, and including a wafer suction head for fixing a wafer on it and a drive means to rotate said suction head; and a brush means including: a rotatory plate having a brushing surface on one side consisting of a flat ring portion and a side-of-cylinder portion, and being capable of shifting axially and in radial directions; a drive means for rotating said rotatory plate circumferentially; a drive means for shifting said rotatory plate axially; and a drive means for shifting said rotatory plate in radial directions, said side-of-cylinder portion of said brushing surface axially extending from the inner boundary of said ring portion, and furthermore, said rotatory plate being disposed such that said flat ring portion of the brushing surface of the brush means is opposed to and in parallel to the unsucked face of the wafer which is held on the suction head, therefore, it is now possible to clean both the unsucked face and the peripheral chamfers of the wafer almost simultaneously and that in a trustworthy manner.

Obviously many modifications and variations of the present invention are possible in the light of the above teachings. It is therefore to be understood that within the scope of the appended claims the invention may be practiced otherwise than is specifically described.

What is claimed is:

1. A scrubber cleaning apparatus for cleaning a thin disk work comprising:

a work holder means capable of holding the work by vacuum suction and turning the work circumferentially, and inclusive of a work suction head for fixing a work on it and a drive means to rotate said suction head; and a brush means including: a rotatory plate having a brushing surface on one side thereof, said brushing surface consisting of a flat ring portion and a side-of-cylinder portion, and being capable of shifting axially and in radial directions; a first drive means for rotatory said rotatory plate; a second drive means for shifting said rotatory plate axially; and a third drive means for shifting said rotatory plate in radial directions, said side-of-cylinder portion of said brushing surface axially extending from the inner boundary of said ring portion, and said rotatory plate being disposed such that said flat ring portion of the brushing surface of the brush means is opposed to and in parallel to the unsucked face of the work which is held on said suction head.

2. The scrubber cleaning apparatus as claimed in claim 1, wherein said suction head is turned in the same direction as said rotatory plate of the brush means, so that said side-of-cylinder portion runs counter to the peripheral chamfers of the work.

* * * * *